United States Patent
Li

(10) Patent No.: US 10,367,980 B1
(45) Date of Patent: Jul. 30, 2019

(54) CAMERA DEVICE INTEGRATED WITH LIGHT SOURCE AND METHOD FOR CAPTURING IMAGES

(71) Applicant: Zheng Li, Shenzhen (CN)

(72) Inventor: Zheng Li, Shenzhen (CN)

( * ) Notice: Subject to any disclaimer, the term of this patent is extended or adjusted under 35 U.S.C. 154(b) by 6 days.

(21) Appl. No.: 15/880,572

(22) Filed: Jan. 26, 2018

(51) Int. Cl.
| | |
|---|---|
| *H04N 5/225* | (2006.01) |
| *H01M 10/052* | (2010.01) |
| *H01M 10/46* | (2006.01) |
| *H05K 1/18* | (2006.01) |
| *H02S 40/38* | (2014.01) |
| *H02J 7/35* | (2006.01) |

(52) U.S. Cl.
CPC ........ *H04N 5/2256* (2013.01); *H01M 10/052* (2013.01); *H01M 10/465* (2013.01); *H04N 5/2252* (2013.01); *H04N 5/2254* (2013.01); *H04N 5/2257* (2013.01); *H05K 1/181* (2013.01); *H01M 2220/10* (2013.01); *H02J 7/35* (2013.01); *H02S 40/38* (2014.12); *H05K 2201/10037* (2013.01); *H05K 2201/10106* (2013.01); *H05K 2201/10121* (2013.01)

(58) Field of Classification Search
CPC .. H04N 5/2256; H04N 5/2254; H04N 5/2257; H04N 5/2252; H05K 1/181; H05K 2201/10106; H05K 2201/10037; H05K 2201/10121; H01M 10/465; H01M 10/052; H01M 2220/10; H02S 40/38; H02J 7/35
See application file for complete search history.

(56) References Cited

U.S. PATENT DOCUMENTS

| | | | | |
|---|---|---|---|---|
| 6,123,263 | A  * | 9/2000 | Feng | G06K 7/10732 235/462.42 |
| 6,912,007 | B2 * | 6/2005 | Gin | G08B 13/19619 348/143 |
| D642,607 | S  * | 8/2011 | Bergstrom | D16/203 |
| D672,382 | S  * | 12/2012 | Zeinoun | D16/203 |
| 10,201,150 | B1 * | 2/2019 | Cottle | A01K 5/0291 |
| 2004/0233284 | A1* | 11/2004 | Lesesky | G08B 13/19619 348/148 |
| 2005/0151851 | A1* | 7/2005 | Schnell | G03B 17/00 348/208.4 |
| 2005/0270414 | A1* | 12/2005 | Lee | G08B 13/19619 348/373 |
| 2007/0075855 | A1* | 4/2007 | Chen | G08B 13/19619 340/541 |

(Continued)

*Primary Examiner* — Timothy J Henn
(74) *Attorney, Agent, or Firm* — Law Offices of Steven W. Weinrieb

(57) ABSTRACT

A camera device includes a cover assembly, a battery, a solar panel, and a camera assembly. The cover assembly includes a lower cover, and an upper cover. The lower cover includes a lower housing and a lower securing board. The upper cover includes an upper housing and an upper securing board. The upper cover is coupled to the lower cover. The lower housing and the upper housing are assembled to a front housing, and the front housing defines an opening. The battery is located between the lower securing board and the upper securing board. The solar panel is located on an upper portion of the upper securing board, and is electrically coupled to the battery. The camera assembly is located in the front housing, and includes a printed circuit board (PCB), a proximity detector, a light source, a camera module, a memory card, a wireless module, and a lens.

10 Claims, 4 Drawing Sheets

(56) References Cited

U.S. PATENT DOCUMENTS

| | | | | |
|---|---|---|---|---|
| 2010/0067898 A1* | 3/2010 | Arbuckle | ............... | G03B 17/08 |
| | | | | 396/535 |
| 2010/0077421 A1* | 3/2010 | Cohen | ................ | G07C 9/00158 |
| | | | | 725/10 |
| 2011/0118549 A1* | 5/2011 | Han | ......................... | A61B 1/04 |
| | | | | 600/109 |
| 2013/0286280 A1* | 10/2013 | Siann | .................... | H04N 5/2252 |
| | | | | 348/372 |
| 2015/0381859 A1* | 12/2015 | Cover | ................. | H04N 5/2252 |
| | | | | 348/374 |
| 2016/0105847 A1* | 4/2016 | Smith | .................... | H04L 67/125 |
| | | | | 370/252 |
| 2018/0068540 A1* | 3/2018 | Romanenko | ......... | G06K 9/3233 |
| 2018/0115691 A1* | 4/2018 | Gupta | .................. | H04N 5/2252 |
| 2018/0151039 A1* | 5/2018 | Lemberger | .......... | H04L 12/4625 |
| 2018/0302559 A1* | 10/2018 | Lee | ......................... | H04N 7/188 |
| 2019/0014291 A1* | 1/2019 | Siminoff | | |
| 2019/0017876 A1* | 1/2019 | Li | ............................. | G01J 5/06 |
| 2019/0082110 A1* | 3/2019 | Jin | ..................... | H04N 5/23296 |

\* cited by examiner

CAMERA DEVICE INTEGRATED WITH LIGHT SOURCE AND METHOD FOR CAPTURING IMAGES

FIELD OF THE INVENTION

The present invention relates to a camera device integrated with a light source and a method for capturing images, the camera device and the method can capture images in a dark area and can transmit the image data to a remote device.

BACKGROUND OF THE INVENTION

A conventional monitoring camera system can be located in yard to monitor a monitor area. However, when the camera works in a dark area, a yard lamp has to be light on to assist the camera. The camera and the yard lamp are separated and installed individually, and they cannot work compatibly with one another.

SUMMARY OF THE INVENTION

The technical problem to be solved by the present invention is to provide a camera device integrated with a light source.

In order to solve the above technical problem, one embodiment of the invention provides the following technical solution:

The embodiment of the invention provides a camera device, includes a cover assembly, a battery, a solar panel, and a camera assembly. The cover assembly includes a lower cover, and an upper cover. The lower cover includes a lower housing and a lower securing board. The upper cover includes an upper housing and an upper securing board. The upper cover is coupled to the lower cover. The lower housing and the upper housing are assembled to a front housing, and the front housing defines an opening. The battery is located between the lower securing board and the upper securing board. The solar panel is located on an upper portion of the upper securing board, and is electrically coupled to the battery. The camera assembly is located in the front housing, and includes a printed circuit board (PCB), a proximity detector, a light source, a camera module, a memory card, a wireless module, and a lens. The PCB is electrically coupled to the battery. The proximity detector is located on a front side of the PCB towards the opening of the front housing, and is configured to detect objects proximate the camera device. The light source is configured to emit light. The light source is located on the front side of the PCB, and includes a plurality of light emitting diode (LED) lamps arranged in circular. The camera module is configured to take photographs. The camera module is electrically coupled to the PCB, and is located on the front side of the PCB. The memory card is configured to store recording data from the camera module. The wireless module is configured to transmit data with other devices. The PCB, the proximity detector, the light source, the camera module, the memory card, and the wireless module are housed within the front housing. The lens covers the opening of the front housing to prevent the light emitted from the light source from being scattered.

As a preferred technical solution of the embodiment of the invention, an angle between two of an emitting direction of the light source, a shooting direction of the camera module, and a sensing direction of the proximity detector is smaller than 180 degrees.

As a preferred technical solution of the embodiment of the invention, the proximity detector comprises a single-chip microprocessor.

As a preferred technical solution of the embodiment of the invention, the wireless module is one of a Bluetooth module, a wireless fidelity module, a 3G communication module, or a 4G communication module.

As a preferred technical solution of the embodiment of the invention, the battery is a rechargeable lithium battery.

As a preferred technical solution of the embodiment of the invention, the solar panel is electrically coupled to the PCB.

As a preferred technical solution of the embodiment of the invention, the light source is a white light source.

As a preferred technical solution of the embodiment of the invention, the camera device is configured be hung on a wall or located on the ground.

The embodiment of the invention also provides a method for capturing images by a camera device. The method includes the following blocks. A solar panel generates electric power from solar power and stores the electric power to the battery. A proximity detector detects a human body proximate the camera device. The camera device emits a light source to light a capture area when an ambient luminance value is smaller than a determined luminance value. A camera module captures images of the human body and stores image data to a memory card. The camera device transmits the image data to a remote server through a wireless module. At least one authorized terminal device obtains the image data from the remote server.

As a preferred technical solution of the embodiment of the invention, the light source is under controlled by the at least one authorized terminal device.

BRIEF DESCRIPTION OF THE DRAWINGS

The drawings are used for providing further understanding of the present invention, constitute a part of the description and are used for explaining the present invention together with the embodiment of the present invention, but do not constitute a limitation to the present invention. In the drawings.

DETAILED DESCRIPTION OF THE EMBODIMENTS

Figure 1:
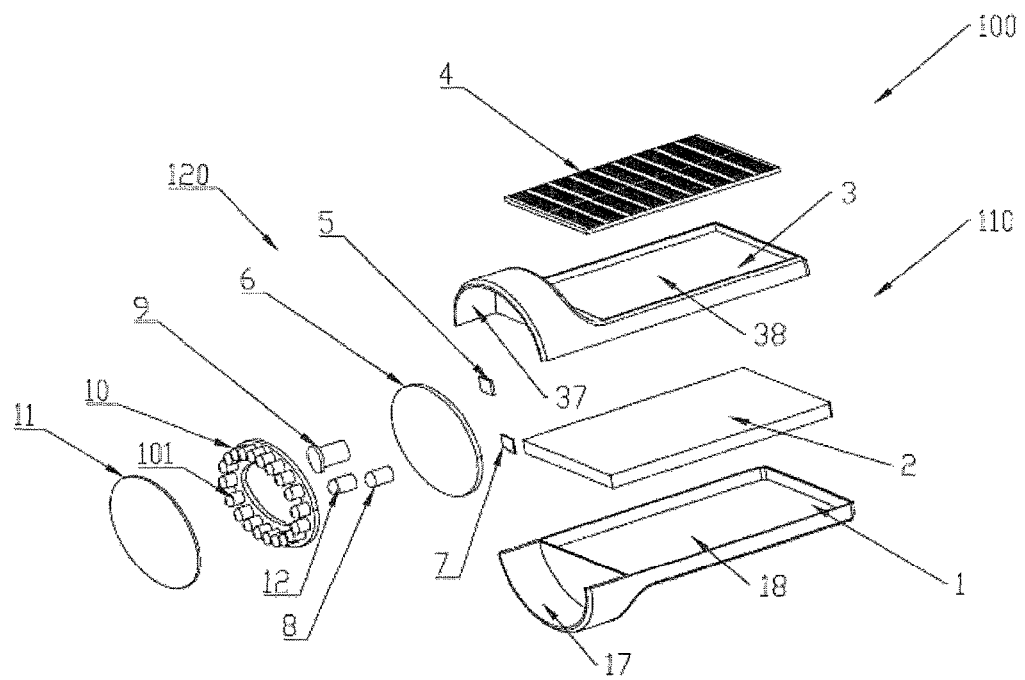
FIG. 1 is a schematic view of one embodiment of a camera device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The word "module", and "unit" as used hereinafter, refers to logic embodied in hardware or firmware, or to a collection of software instructions, written in a programming language, such as, for example, Java, C, or assembly. One or more software instructions in the modules may be embedded in firmware. It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable storage medium or other computer storage device. The term "comprising," when utilized, means "including, but not necessarily limited to"; it specifically indicates open-ended inclusion or membership in the so-described combination, group, series and the like.

Figure 2:
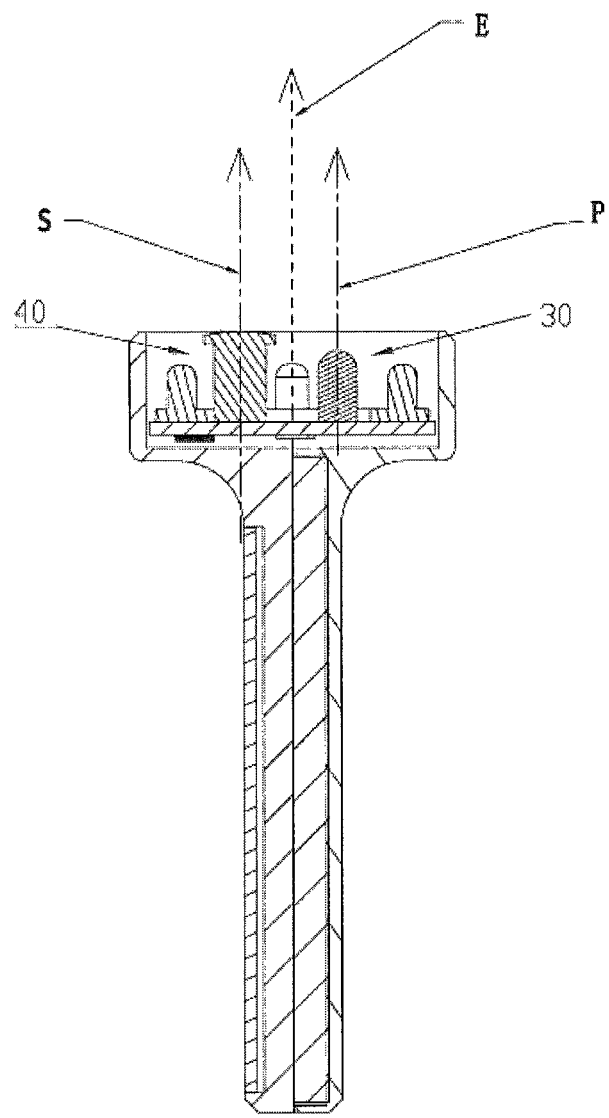
FIG. 2 is an assembled sectional diagrammatic view of the camera device of FIG. 1.

As shown in FIG. 1 and FIG. 2, in one embodiment, a camera device 100 is integrated with a light source 10. The camera device 100 can be hung on a wall or be located on the ground.

The camera device 100 includes a cover assembly 110, a battery 2, a solar panel 4, and a camera assembly 120. The cover assembly 110 includes a lower cover 1 and an upper cover 3. The lower cover 1 includes a lower housing 17 and a lower securing board 18. The lower housing 17 is located on one end of the lower securing board 18. The upper cover 3 includes an upper housing 37 and an upper securing board 38. The upper housing 37 is located on one end of the upper securing board 18. The lower cover 1 and the upper cover 2 can be secured, and the lower housing 17 and the upper housing 37 can form a front housing 30, and a receiving space is defined in the front housing 30 for receiving the camera assembly 120. An opening 40 is defined in the front housing 30. The opening 40 is substantially circular.

The battery 2 is located between the lower securing board 18 and the upper securing board 38. The battery 2 is a rechargeable lithium battery. The solar panel 4 is located on an upper portion of the upper securing board 38, and is electrically coupled to the battery 2.

The camera assembly 120 includes a printed circuit board (PCB) 6, a proximity detector 8, the light source 10, a camera module 9, a memory card 7, a wireless module 5, a lens 11, and a photoconductive resistance 12. The PCB 6 is electrically coupled to the battery 2 and the solar panel 4. The solar panel 4 can directly power to the PCB 6. The proximity detector 8 is located on a front side of the PCB 6 towards the opening 40 of the front housing 30, to detect objects proximate the camera device 100. The proximity detector 8 may include a single-chip microprocessor. The light source 10 can emit light, and is located on the front side of the PCB 6. The light source 10 includes a plurality of light emitting diode (LED) lamps 101 arranged in circular. The light source 10 can emit white light. The camera module 9 can take photographs in a capture area. The camera module 9 is electrically coupled to the PCB 6, and is located on the front side of the PCB 6. The memory card 7 stores recording data from the camera module 9. The memory card 7 can be a SD card. The wireless module 5 can transmit data with other devices. The wireless module 5 can be one of a Bluetooth module, a wireless fidelity module, a 3G communication module, or a 4G communication module. The memory card 7 and the wireless module 5 are located on a rear side of the PCB 6. The PCB 6, the proximity detector 8, the light source 10, the camera module 9, the memory card 7, and the wireless module 5 are housed within the front housing 30. The lens 11 covers the opening 40 of the front housing 30 to prevent the light emitted from the light source 10 from being scattered. The photoconductive resistance 12 can detect if an ambient luminance value is smaller than a determined luminance value.

As shown in FIG. 2, when the proximity detector 8 detects a human body, the light source 10 and the camera module 9 can be powered on. An angle between two of an emitting direction E of the light source 10, a shooting direction S of the camera module 9, and a sensing direction P of the proximity detector 8 is smaller than 180 degrees.

Figure 3:
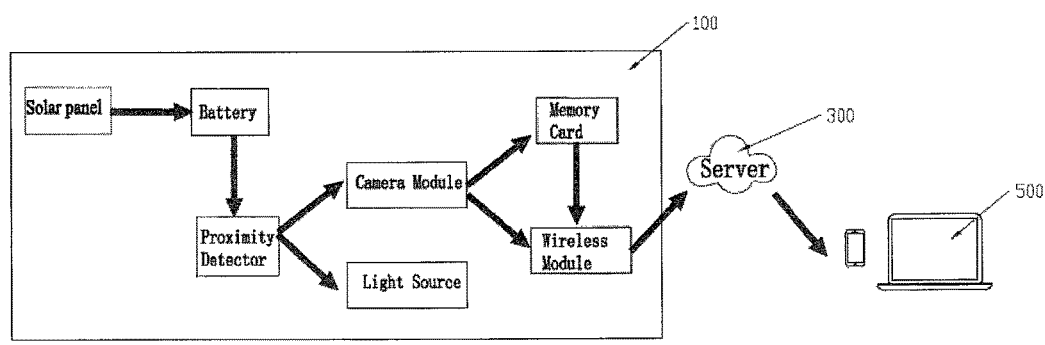
FIG. 3 is a block view of the camera device of FIG. 1.

As shown in FIG. 3, when the camera device 100 is used, the solar panel 4 transmits the solar power to the electric power, and stores the electric power to the battery 2. The proximity detector 8 detects if a human body proximate the camera device 100. When an ambient luminance value of the photoconductive resistance 12 is smaller than a determined luminance value, the light source 10 is powered on to light a capture area of the camera module 9. The camera module 9 captures images of the human body and stores image data to the memory card 7. The image data is then transmitted to a remote server 300 through the wireless module 5. At least one authorized terminal device 500, such as a mobile phone or a computer, can obtain the image data from the remote server 300. The at least one authorized terminal device 500 or the server 300 can also control the camera device 100, for example, an authorized mobile phone can power on the light source 10 and the camera module 9 to take images of a proximate human body. The camera device 100 can search and connect available wireless points to connect to the Internet at regular time, such as 10 seconds. The camera device 100 can be controlled by the authorized terminal device 500 through connection of a nearest wireless router. The authorized terminal device 500 can control the camera device 100 to power on or power off the light source, to achieve two-way talkback function, and to take video monitor.

Figure 4:
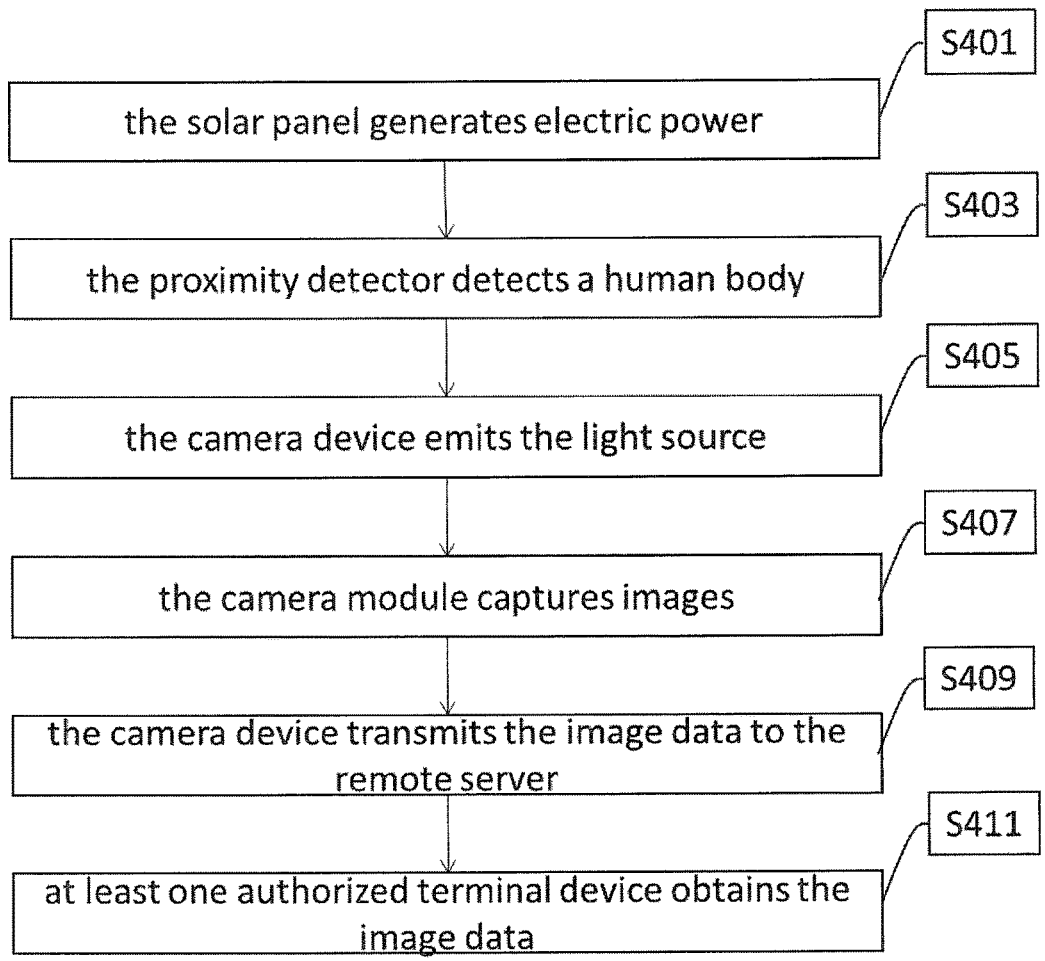
FIG. 4 is a flowchart of one embodiment of a method for capturing images.

As shown in FIG. 4, in the embodiment, a method for capturing image by the camera device 100 may include the following blocks.

Block S401, the solar panel 4 generates electric power from solar power and stores the electric power to the battery.

Block S403, the proximity detector 8 detects a human body proximate the camera device 100.

Block S405, the camera device emits the light source 10 to light a capture area when an ambient luminance value is smaller than a determined luminance value.

Block S407, the camera module captures images of the human body and stores image data to the memory card 7.

Block S409, the camera device transmits the image data to the remote server 300 through the wireless module 5.

Block S411, at least one authorized terminal device obtains the image data from the remote server 300.

The camera device in the embodiment may have following advantages. The camera device is integrated with the solar panel, the light source, and the camera module. The total manufacturing cost camera device is reduced. The camera device can be installed once, and can be directly powered by solar power. The proximity detector can detect human body, and the capture area can be lighted by the light source as required. The camera device can also take video monitor and give alarms to the remote mobile phones and the computers.

The embodiments shown and described above are only examples. Many details are often found in the art such as the other features of a system for generating picture thumbnail. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

The invention claimed is:

1. A camera device, comprising:
   a cover assembly, comprising a lower cover comprising a lower housing and a lower securing board; and an upper cover, comprising an upper housing and an upper securing board, and coupled to said lower cover, wherein said lower housing and said upper housing are assembled to a front housing, and wherein said front housing defines an opening;
   a battery located between said lower securing board and upper securing board;
   a solar panel located upon an upper portion of said upper securing board and electrically coupled to said battery; and
   a camera assembly, located within said front housing and comprising a printed circuit board (PCB) electrically coupled to said battery; a proximity detector located upon a front side of said printed circuit board (PCB) toward said opening of said front housing for detecting objects proximate to said camera assembly; a light source for emitting light, located upon a front side portion of said printed circuit board (PCB), and comprising a plurality of light emitting diode (LED) lamps arranged in a circular array; a camera module for taking photographs, electrically coupled to said printed circuit board (PCB), and located upon a front side portion of said printed circuit board(PCB); and a memory card for storing recording data from said camera module; and a wireless module for transmitting data to other devices; wherein said printed circuit board (PCB), said proximity detector, said light source, said camera module, said memory card, and said wireless module are all housed within said front housing of said cover assembly; and
   a lens covering said opening defined within said front housing of said cover assembly so as to prevent light emitted from said light source from being scattered.

2. The camera device of claim 1, wherein an angle between two of an emitting direction of the light source, a shooting direction of the camera module, and a sensing direction of the proximity detector, is smaller than 180 degrees.

3. The camera device of claim 1, wherein the proximity detector comprises a single-chip microprocessor.

4. The camera device of claim 1, wherein the wireless module is one of a Bluetooth module, a wireless fidelity module, a 3G communication module, or a 4G communication module.

5. The camera device of claim 1, wherein the battery is a rechargeable lithium battery.

6. The camera device of claim 1, wherein the solar panel is electrically coupled to said printed circuit board (PCB).

7. The camera device of claim 1, wherein the light source is a white light source.

8. The camera device of claim 1, wherein said camera assembly is configured to be hung on a wall or located on the ground.

9. A method for capturing images by a camera device, comprising the steps of:
   using a camera device comprising a cover assembly comprising a lower cover comprising a lower housing and a lower securing board, and an upper cover, comprising an upper housing and an upper securing board, and coupled to said lower cover, wherein said lower housing and said upper housing are assembled to a front housing, and wherein said front housing defines an opening; a battery located between said lower securing board and upper securing board; a solar panel located upon an upper portion of said upper securing board and electrically coupled to said battery; and a camera assembly, located within said front housing and comprising a printed circuit board (PCB) electrically coupled to said battery; a proximity detector located upon a front side of said printed circuit board (PCB) toward said opening of said front housing for detecting objects proximate to said camera assembly; a light source for emitting light, located upon a front side portion of said printed circuit board (PCB), and comprising a plurality of light emitting diode (LED) lamps arranged in a circular array; a camera module for taking photographs, electrically coupled to said printed circuit board (PCB), and located upon a front side portion of said printed circuit board (PCB); and a memory card for storing recording data from said camera module; and a wireless module for transmitting data to other devices; wherein said printed circuit board (PCB), said proximity detector, said light source, said camera module, said memory card, and said wireless module are all housed within said front housing of said cover assembly; and a lens covering said opening defined within said front housing of said cover assembly so as to prevent light emitted from said light source from being scattered;
   generating electric power from solar power collected by said solar panel and storing said electric power within said battery;
   using said proximity detector for detecting an object proximate to said camera device;
   emitting light from said light source into a capture area, within which said object is disposed, when an ambient luminance value is smaller than a predetermined luminance value;
   capturing images of said object from said capture area and storing image data to said memory card;
   transmitting said image data from said memory card to a server through a wireless module; and
   obtaining said image data from said server at at least one authorized terminal device.

10. The method of claim 9, wherein said light source is controlled by at least one authorized terminal device.

* * * * *